(12) United States Patent
Moriwaki

(10) Patent No.: US 8,698,248 B2
(45) Date of Patent: Apr. 15, 2014

(54) SEMICONDUCTOR DEVICE AND METHOD OF FORMING THE SAME

(76) Inventor: Yoshikazu Moriwaki, Tokyo (JP)

(*) Notice: Subject to any disclaimer, the term of this patent is extended or adjusted under 35 U.S.C. 154(b) by 1047 days.

(21) Appl. No.: 12/108,554

(22) Filed: Apr. 24, 2008

(65) Prior Publication Data

US 2008/0265332 A1 Oct. 30, 2008

(30) Foreign Application Priority Data

Apr. 27, 2007 (JP) .................................. 2007-120317

(51) Int. Cl.
*H01L 21/70* (2006.01)

(52) U.S. Cl.
USPC .................................. 257/369; 257/E27.062

(58) Field of Classification Search
USPC .......... 257/369, 371, 374, E27.067, E27.069, 257/E27.108, E29.057, E29.059
See application file for complete search history.

(56) References Cited

U.S. PATENT DOCUMENTS

| | | | |
|---|---|---|---|
| 5,438,007 A * | 8/1995 | Vinal et al. | 438/289 |
| 5,932,919 A * | 8/1999 | Schwalke | 257/369 |
| 6,232,163 B1 * | 5/2001 | Voldman et al. | 438/212 |
| 6,261,885 B1 * | 7/2001 | Cheek et al. | 438/199 |
| 6,399,453 B2 | 6/2002 | Nagai et al. | |
| 6,528,381 B2 | 3/2003 | Lee et al. | |
| 6,730,572 B2 | 5/2004 | Lee et al. | |

FOREIGN PATENT DOCUMENTS

| | | |
|---|---|---|
| JP | 02-265248 | 10/1990 |
| JP | 2000-77540 | 3/2000 |
| JP | 2000-236028 | 8/2000 |
| JP | 2001-244346 | 9/2001 |
| JP | 2002-16237 | 1/2002 |
| JP | 2004-03-25 | 3/2004 |

* cited by examiner

*Primary Examiner* — Vongsavanh Sengdara
(74) *Attorney, Agent, or Firm* — Young & Thompson

(57) ABSTRACT

A semiconductor device may include an n-MOS transistor, and a p-MOS transistor. The p-MOS transistor may include, but is not limited to, a gate insulating film and a gate electrode. The gate electrode may have an adjacent portion that is adjacent to the gate insulating film. The adjacent portion may include a polysilicon that contains an n-type dopant and a p-type dopant.

14 Claims, 7 Drawing Sheets

SEMICONDUCTOR DEVICE AND METHOD OF FORMING THE SAME

BACKGROUND OF THE INVENTION

1. Field of the Invention

The present invention generally relates to a semiconductor device and a method of forming the same. More specifically, the present invention relates to a semiconductor device that is used for a CMOS circuit that includes n-MOS transistors and p-MOS transistors.

Priority is claimed on Japanese Patent Application No. 2007-120317, filed Apr. 27, 2007, the content of which is incorporated herein by reference.

2. Description of the Related Art

All patents, patent applications, patent publications, scientific articles, and the like, which will hereinafter be cited or identified in the present application, will hereby be incorporated by reference in their entirety in order to describe more fully the state of the art to which the present invention pertains.

The semiconductor integrated circuit has an integration of a large number of MOS field effect transistors. The MOS field effect transistors that are integrated on the semiconductor integrated circuit are classified into n-MOS transistors and p-MOS transistors. Most of the n-MOS transistors and p-MOS transistors constitute CMOS circuits. Scaling down of the n-MOS transistors and p-MOS transistors are necessary for improving the high speed performances of the semiconductor device or the CMOS circuits and also for realizing large scale integration.

Scaling down of the n-MOS transistors and p-MOS transistors needs reduction in thickness of gate insulating films in those transistors. Reduction in thickness of the gate insulating film may raise the problem with negative bias temperature instability (hereinafter referred to as NBTI) of the p-MOS transistors, resulting in decrease of the reliability of the p-MOS transistors. NBTI is the phenomenon that a negative bias voltage (Vg<0) as a stress voltage is continuously applied to the gate electrode of the p-MOS transistor, thereby increasing the threshold voltage of the p-MOS transistor and decreasing the on-current. This phenomenon may cause malfunction of the circuits. The problem in reliability with the NBTI provides the bars to reduction in thickness of the gate insulating film of the p-MOS transistor and also to improvement in high speed performance of the CMOS circuit.

In order to countermeasure the NBTI problem, it was proposed to increase the thickness (Tox(PMOS)) of the gate insulating film of the p-MOS transistor so as to reduce the field applied to the gate insulating film of the p-MOS transistor, while unchanging the thickness (Tox(NMOS)) of the gate insulating film of the n-MOS transistor. Forming thickness-difference gate insulating films of the n-MOS transistor and the p-MOS transistor needs additional lithography process, for example, multi-oxide photo-resist process, resulting in increasing the number of manufacturing process for the semiconductor device.

FIGS. 4A through 4F are fragmentary cross sectional elevation views illustrating conventional semiconductor devices in sequential steps involved in a conventional method of manufacturing the same. FIG. 5 is a fragmentary cross sectional elevation view illustrating the conventional semiconductor device that is formed by the conventional manufacturing method shown in FIGS. 4A through 4F. The conventional semiconductor device has an n-MOS transistor and a p-MOS transistor. The n-MOS transistor has a second gate insulating film of a second thickness Tox(NMOS). The p-MOS transistor has a first gate insulating film of a first thickness Tox(PMOS). The first thickness Tox(PMOS) is greater than the second thickness Tox(NMOS).

With reference to FIG. 4A, isolation regions 102 are selectively formed in an upper region of a silicon substrate 101, thereby defining active regions on the silicon substrate 101. A first gate insulating film 103 is formed over the active regions on the silicon substrate 101 and the isolation regions 102. The first gate insulating film 103 has a first thickness in the range of 3 nanometers to 10 nanometers.

With reference to FIG. 4B, the silicon substrate 101 has an n-MOS transistor region 104a and a p-MOS transistor region 104b. A first resist film is applied on the first gate insulating film 103. A photo-lithography process is carried out to form a first resist pattern 105 in the p-MOS transistor region 104b. The first resist pattern 105 has an opening over the n-MOS transistor region 104a. A wet etching process is carried out using the first resist pattern 105 as a mask to selectively remove the first gate insulating film 103 in the n-MOS transistor region 104a, while leaving the first gate insulating film 103 in the p-MOS transistor region 104b. The surface of the n-MOS transistor region 104a of the silicon substrate 101 is shown. The wet etching process is carried out using an HF-based etchant.

With reference to FIG. 4C, the first resist pattern 105 is removed. A thermal oxidation process is carried out to selectively form a second gate insulating film 106 on the n-MOS transistor region 104a of the silicon substrate 101. The second gate insulating film 106 has a second thickness in the range of 1 nanometer to 3 nanometers. The first gate insulating film 103 is formed in the p-MOS transistor region 104b. The second gate insulating film 106 is formed in the n-MOS transistor region 104a. The first gate insulating film 103 on the p-MOS transistor region 104b is greater in thickness than the second gate insulating film 106 on the n-MOS transistor region 104a.

With reference to FIG. 4D, a thermal chemical vapor deposition process is carried out to form a non-doped polysilicon layer 108 over the first gate insulating film 103 on the p-MOS transistor region 104b and the second gate insulating film 106 on the n-MOS transistor region 104a. The non-doped polysilicon layer 108 has a thickness in the range of 50 nanometers to 100 nanometers.

With reference to FIG. 4E, a second photo-resist film is applied on the non-doped polysilicon layer 108. A lithography process is carried out to form a second resist pattern 111 on the non-doped polysilicon layer 108. A dry etching process is carried out using the second resist pattern 111 as a mask to selectively remove the non-doped polysilicon layer 108, thereby forming gate electrodes 110a and 110b on the second and first gate insulating films 106 and 103 in the n-MOS transistor region 104a and the p-MOS transistor region 104b.

With reference to FIG. 4F, the second resist pattern 111 is removed from the gate electrodes 108. A first ion-implantation of n-type dopant is carried out using the gate electrode 110a as a mask to selectively introduce the n-type dopant into the n-MOS transistor region 104a of the silicon substrate 101, thereby selectively forming n-doped regions in the n-MOS transistor region 104a. A second ion-implantation of p-type dopant is carried out using the gate electrode 110b as a mask to selectively introduce the p-type dopant into the p-MOS transistor region 104b of the silicon substrate 101, thereby selectively forming p-doped regions in the p-MOS transistor region 104b.

Side wall insulating films 113 are selectively formed on the side walls of the gate electrodes 110a and 10b. The side wall insulating films 113 have a thickness in the range of 5 nanometers to 20 nanometers. The side wall insulating films 113 may be made of an insulator such as oxide or nitride.

A third ion-implantation of n-type dopant is carried out using the side walls 113 and the gate electrode 110a as a mask to selectively introduce the n-type dopant into the n-MOS transistor region 104a of the silicon substrate 101, thereby selectively forming n-type source and drain regions 112a and 112c of lightly doped drain structures in n-MOS transistor region 104a. The third ion-implantation is carried out at higher acceleration energy than that of the first ion-implantation so as to introduce the n-type dopant into the deeper level than the n-doped regions, thereby forming the n-type source and drain regions 112a and 112c having the n-type lightly doped drain structures.

A fourth ion-implantation of p-type dopant is carried out using the side walls 113 and the gate electrode 110b as a mask to selectively introduce the p-type dopant into the p-MOS transistor region 104b of the silicon substrate 101, thereby selectively forming p-type source and drain regions 112b and 112d of lightly doped drain structures in p-MOS transistor region 104b. The fourth ion-implantation is carried out at higher acceleration energy than that of the second ion-implantation so as to introduce the p-type dopant into the deeper level than the p-doped regions, thereby forming the p-type source and drain regions 112b and 112d having the p-type lightly doped drain structures.

The gate electrode 110a in the n-MOS transistor region 104a is doped with the n-type dopant by the first and third ion-implantations. The gate electrode 110b in the p-MOS transistor region 104b is doped with the p-type dopant by the second and fourth ion-implantations.

An annealing process is carried out to activate the n-type dopant and the p-type dopant in the n-type source and drain regions 112a and 112c and the p-type source and drain regions 112b and 112d.

With reference to FIG. 5, an inter-layer insulator 114 is formed over the first and second gate insulating films 103 and 106 and the gate electrodes 110a and 110b with the side wall insulating films 113. Contact holes are formed in the inter-layer insulator 114. The contact holes penetrate the inter-layer insulator 114. The contact holes reach the n-type source and drain regions 112a and 112c and the p-type source and drain regions 112b and 112d as well as the gate electrodes 110a and 110b. Contact plugs 115 are formed in the contact holes of the inter-layer insulator 114. The contact plugs 115 penetrate the inter-layer insulator 114. The contact plugs 115 contact the n-type source and drain regions 112a and 112c and the p-type source and drain regions 112b and 112d. The contact plugs 115 contact the gate electrodes 110a and 110b. Metal interconnections 116 are formed over the inter-layer insulator 114 and the contact plugs 115. The metal interconnections 116 contact the contact plugs 115 so that the metal interconnections 116 are electrically connected through the contact plugs 115 to the n-type source and drain regions 112a and 112c and the p-type source and drain regions 112b and 112d as well as to the gate electrodes 100a and 100b. A passivation film 117 is formed over the metal interconnections 116 and the inter-layer insulator 114, thereby completing a semiconductor device having a CMOS circuit.

Japanese Unexamined Patent Application, First Publication, No. 2-265248 discloses the source and drain regions having the lightly doped drain structure that can solve the problems that scaling down of the transistors causes field concentration near the drain thereby generating hot carriers and varying the threshold of the transistor.

As described above, the above-described conventional semiconductor device having the CMOS circuit includes the n-MOS transistor having the second gate insulating film 106 and the p-MOS transistor having the first gate insulating film 103. The n-MOS transistor has the second gate insulating film 106 of the second thickness Tox(NMOS). The p-MOS transistor has the first gate insulating film of the first thickness Tox(PMOS). The first thickness Tox(PMOS) is greater than the second thickness Tox(NMOS). Forming the first and second gate insulating films 106 and 103 that differ in thickness from each other would need the following additional processes. The first gate insulating film 103 is formed over the n-MOS transistor region 104a and the p-MOS transistor region 104b. The first resist pattern 105 is formed over the gate insulating film 103 by the lithography process. The first resist pattern 105 has an opening that is positioned in the n-MOS transistor region 104a. The first gate insulating film 103 is selectively removed from the n-MOS transistor region 104a by using the first resist pattern 105 as a mask, while leaving the first gate insulating film 103 in the p-MOS transistor region 104b. The second gate insulating film 106 is selectively formed on the n-MOS transistor region 104a. The above-described additional processes increase the number of processes for manufacturing the semiconductor device.

Taking into account only the countermeasure to the NBTI problem of the p-MOS transistor, it could be proposed that, without carrying out any additional lithography processes, a single gate insulating film with a larger uniform thickness is formed over the n-MOS transistor region 104a and the p-MOS transistor region 104b. The thick gate insulating film on the n-MOS transistor region 104a may excessively reduce the on-current of the n-MOS transistor.

In view of the above, it will be apparent to those skilled in the art from this disclosure that there exists a need for an improved semiconductor device and/or method of forming the same. This invention addresses this need in the art as well as other needs, which will become apparent to those skilled in the art from this disclosure.

SUMMARY OF THE INVENTION

Accordingly, it is a primary object of the present invention to provide a semiconductor device including CMOS circuits.

It is another object of the present invention to provide a semiconductor device including CMOS circuits, which has a high reliability in NBTI.

It is a further object of the present invention to provide a semiconductor device including CMOS circuits, which does not need a process for etching the gate insulating film.

It is a still further object of the present invention to provide a semiconductor device including CMOS circuits, which can be formed by simplified processes.

It is yet a further object of the present invention to provide a method of forming a semiconductor device including CMOS circuits.

It is an additional object of the present invention to provide a method of forming a semiconductor device including CMOS circuits, which has a high reliability in NBTI.

It is another object of the present invention to provide a method of forming a semiconductor device including CMOS circuits, which does not need a process for etching the gate insulating film.

It is still another object of the present invention to provide a method of forming a semiconductor device including CMOS circuits by simplified processes.

In accordance with a first aspect of the present invention, a semiconductor device may include, but is not limited to, an n-MOS transistor, and a p-MOS transistor. The p-MOS transistor may include, but is not limited to, a gate insulating film and a gate electrode. The gate electrode may have an adjacent portion that is adjacent to the gate insulating film. The adjacent portion may include a polysilicon that contains an n-type dopant and a p-type dopant.

The gate electrode containing the adjacent portion of the p-MOS transistor can ensure that the p-MOS transistor be superior in NBTI reliance. In other words, the gate electrode containing the adjacent portion of the p-MOS transistor can improve the NBTI lifetime without carrying out any additional process for the gate insulating film. The gate electrode containing the adjacent portion can provide substantially similar effects as when the gate insulating film of the p-MOS transistor is thicker than the gate insulating film of the n-MOS transistor. The gate electrode containing the adjacent portion can increase the flexibility of designing the gate insulating film such as the thickness thereof. The increased flexibility can make it easier to obtain improved performance of the transistors.

In some cases, the adjacent portion has a thickness of at least 30 nanometers from the interface between the gate electrode and the gate insulating film, thereby improving the certainty of the NBTI reliance of the p-MOS transistor. The adjacent portion with the thickness of at least 30 nanometers contains the n-type dopant, which can reduce or prevent that the p-type dopant such as boron as introduced in the gate electrode of the p-MOS transistor is thermally diffused through the gate insulating film to the semiconductor substrate, while the heat treatment is carried out. This reduction or prevention can improve the NBTI reliance.

In some cases, it is preferable that the adjacent portion having the thickness of at least 30 nanometers from the interface between the gate electrode and the gate insulating film has a compositional ratio of the n-type dopant to the p-type dopant in the range of 10% to 40%. The adjacent portion with this compositional ratio can ensure good performance such as on-current of the p-MOS transistor and improvement of the NBTI reliance.

The gate electrode may have a stacked structure that includes a lower portion that includes the adjacent portion, and an upper portion over the lower portion. The lower portion may include the polysilicon containing the n-type dopant and the p-type dopant. The upper portion contains the polysilicon containing the p-type dopant.

In accordance with a second aspect of the present invention, a method of forming a semiconductor device including an n-MOS transistor and a p-MOS transistor may include, but is not limited to, the following processes. A gate insulating film may be formed over an n-MOS transistor region and a p-MOS transistor region of a semiconductor substrate. A first polysilicon layer may be formed over the gate insulating film, the first polysilicon layer containing an n-type dopant. A second polysilicon layer may be formed over the first polysilicon layer. The second polysilicon layer may be substantially free of any dopant. The stack of the first and second polysilicon layers is patterned to form gate electrode structures in the n-MOS transistor region and the p-MOS transistor region. A first ion-implantation process of an n-type dopant to the n-MOS transistor region may be carried out, thereby introducing the n-type dopant into the first and second polysilicon layers in the n-MOS transistor region and into source and drain formation regions of the semiconductor substrate in the n-MOS transistor region. A second ion-implantation process of a p-type dopant to the p-MOS transistor region may be carried out, thereby introducing the p-type dopant into the first and second polysilicon layers in the p-MOS transistor region and into source and drain formation regions of the semiconductor substrate in the p-MOS transistor region.

The semiconductor device that is superior in the NBTI reliance can be formed by the simple processes.

In some cases, the method of forming the semiconductor device may further include the following processes. Side walls may be formed on side faces of the gate electrode structures in the n-MOS transistor region and the p-MOS transistor region, after carrying out the first and second ion-implantation processes. A third ion-implantation process of an n-type dopant to the n-MOS transistor region may be carried out using the side walls as a mask, thereby introducing the n-type dopant into the first and second polysilicon layers in the n-MOS transistor region and into the source and drain formation regions of the semiconductor substrate in the n-MOS transistor region. A fourth ion-implantation process of a p-type dopant to the p-MOS transistor region may be carried out using the side walls as a mask, thereby introducing the p-type dopant into the first and second polysilicon layers in the p-MOS transistor region and into the source and drain formation regions of the semiconductor substrate in the p-MOS transistor region.

This structure can relax the field concentration in the vicinity of the drain of each of the n-MOS transistor and the p-MOS transistor, thereby obtaining good performance of those transistors.

In some cases, the method of forming the semiconductor device may further include the following processes. An annealing process for the semiconductor substrate may be carried out, after carrying out the third and fourth ion-implantation processes, so that the n-type dopant is localized near the interface between the gate electrode and the gate insulating film.

In some cases, it may be preferable that the first ion-implantation process is carried out at a dose in the range of 1E13 atoms/cm$^2$ to 1E15 atoms/cm$^2$. The concentration of the n-type dopant of the first polysilicon layer may be preferably in the range of 1E19 atoms/cm$^3$ to 1E21 atoms/cm$^3$. The semiconductor device having superior NBTI reliance of the p-MOS transistor can be formed.

In accordance with the present invention, the semiconductor device includes the n-MOS transistor and the p-MOS transistor. The p-MOS transistor may include a gate insulating film and a gate electrode. The gate electrode may have an adjacent portion that is adjacent to the gate insulating film. The adjacent portion may include a polysilicon that contains an n-type dopant and a p-type dopant.

The gate electrode containing the adjacent portion of the p-MOS transistor can ensure that even if the gate insulating film of the n-MOS transistor has the same thickness as that of the p-MOS transistor, the semiconductor device can have similar performance to that obtained by the semiconductor device in which the gate insulating film of the p-MOS transistor is thicker than the gate insulating film of the n-MOS transistor. The gate electrode containing the adjacent portion of the p-MOS transistor can ensure that the p-MOS transistor be superior in NBTI reliance. The gate electrode containing the adjacent portion can increase the flexibility of designing the gate insulating film such as the thickness thereof. The increased flexibility can make it easier to obtain improved performance of the transistors.

The gate electrode has a stacked structure that includes the first polysilicon layer containing the n-type dopant in the vicinity of the interface between the gate electrode and the gate insulating film, thereby allowing formation of the semiconductor device that is superior in the NBTI performance.

The stack of the first polysilicon layer containing the n-type dopant and the second polysilicon layer substantially free of any dopant can be formed by the continuous chemical vapor deposition process with changing the reaction gas. The gate insulating film with the uniform thickness can be disposed over the n-MOS transistor region and the p-MOS transistor region. The process for forming the thickness-uniform gate insulating film is simpler than the process for forming the thickness-varying gate insulating film. The stack of the first and second polysilicon layers do not need any additional process such as a lithography process and an etching process for differentiating the thickness of the gate insulating film. The above-described gate electrode and the thickness-uniform gate electrode can allow that the CMOS circuit having high NBTI reliance is formed by the simplified processes.

These and other objects, features, aspects, and advantages of the present invention will become apparent to those skilled in the art from the following detailed descriptions taken in conjunction with the accompanying drawings, illustrating the embodiments of the present invention.

BRIEF DESCRIPTION OF THE DRAWINGS

Referring now to the attached drawings which form a part of this original disclosure.

DETAILED DESCRIPTION OF THE INVENTION

Selected embodiments of the present invention will now be described with reference to the drawings. It will be apparent to those skilled in the art from this disclosure that the following descriptions of the embodiments of the present invention are provided for illustration only and not for the purpose of limiting the invention as defined by the appended claims and their equivalents.

Figure 1:
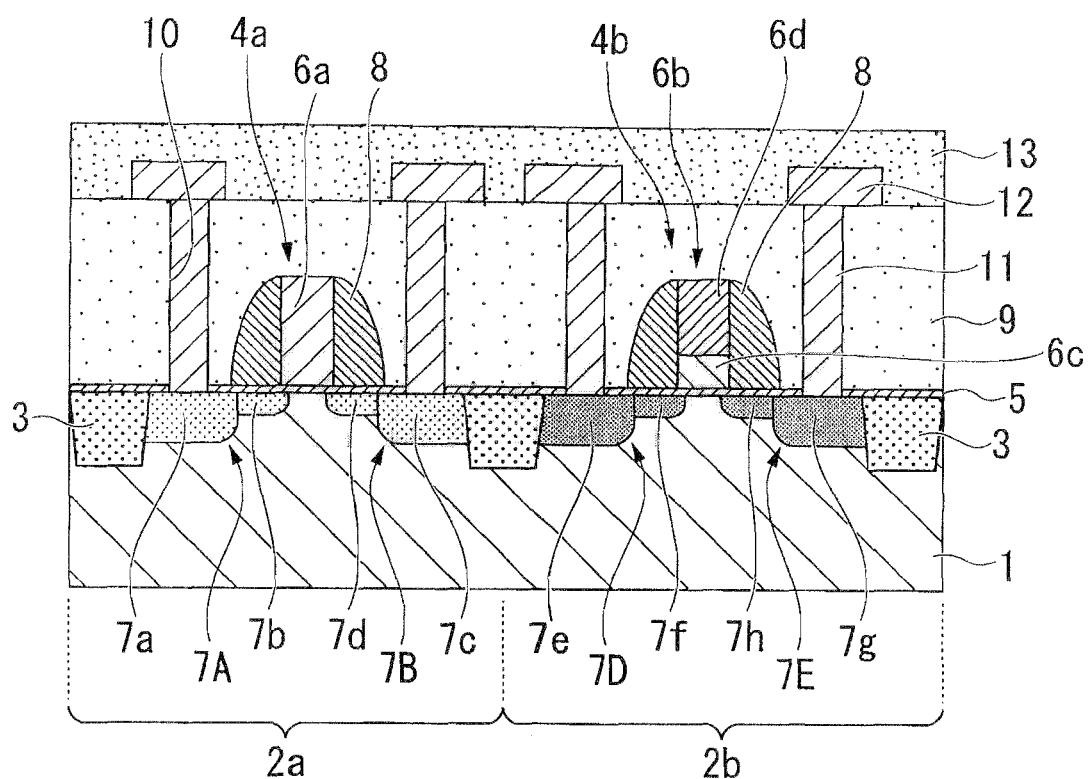
FIG. 1 is a fragmentary cross sectional elevation view illustrating a semiconductor device having CMOS circuits in accordance with a first preferred embodiment of the present invention.

FIG. 1 is a fragmentary cross sectional elevation view illustrating a semiconductor device having CMOS circuits in accordance with a first preferred embodiment of the present invention.

The semiconductor device is provided over a semiconductor substrate 1. The semiconductor device has an n-MOS transistor region 2a and a p-MOS transistor region 2b. The semiconductor device includes an n-MOS transistor 4a in the n-MOS transistor region 2a and a p-MOS transistor 4b in the p-MOS transistor region 2b.

In some cases, the semiconductor substrate 1 may be made of a semiconductor containing a dopant at a predetermined concentration. In a typical case, the semiconductor substrate 1 may be made of, but is not limited to, silicon. Isolation regions 3 are selectively disposed in an upper region of the semiconductor substrate 1. The isolation regions 3 isolate the n-MOS transistor region 2a and the p-MOS transistor region 2b from each other. The isolation regions 3 isolate the n-MOS transistor 4a and the p-MOS transistor 4b from each other. In some cases, the isolation regions 3 can be formed by a shallow trench isolation method.

A gate insulating film 5 is provided over the n-MOS transistor region 2a and the p-MOS transistor region 2b of the semiconductor substrate 1. In some cases, the gate insulating film 5 may be made of silicon oxide. In this case, the gate insulating film 5 of silicon oxide can be formed by a thermal oxidation of silicon.

The n-MOS transistor 4a is disposed in the n-MOS transistor region 2a. The p-MOS transistor 4b is disposed in the p-MOS transistor region 2b. The combination of the n-MOS transistor 4a and the p-MOS transistor 4b constitutes a CMOS circuit.

The n-MOS transistor 4a may include the gate insulating film 5, a gate electrode 6a, side walls 8, a source 7A, and a drain 7B. The source 7A has a first diffusion region 7a and a second diffusion region 7b. The second diffusion region 7b is a lightly doped region of the source 7A. The drain 7B has a third diffusion region 7c and a fourth diffusion region 7c. The fourth diffusion region 7d is a lightly doped region of the drain 7B. The second and fourth diffusion regions 7b and 7d are positioned under the side walls 8. The first and third diffusion regions 7a and 7c are positioned outside the second and fourth diffusion regions 7b and 7d, respectively.

The p-MOS transistor 4b may include the gate insulating film 5, a gate electrode 6b, side walls 8, a source 7D, and a drain 7E. The source 7D has a fifth diffusion region 7e and a sixth diffusion region 7f. The sixth diffusion region 7f is a lightly doped region of the source 7D. The drain 7E has a seventh diffusion region 7g and an eighth diffusion region 7h. The eighth diffusion region 7h is a lightly doped region of the drain 7E. The sixth and eighth diffusion regions 7f and 7h are positioned under the side walls 8. The fifth and seventh diffusion regions 7e and 7g are positioned outside the sixth and eighth diffusion regions 7f and 7h, respectively.

In the n-MOS transistor region 2a, the gate electrode 6a may be made of a polysilicon doped with an n-type dopant. The side walls 8 made of an insulator are disposed on the side faces of the gate electrode 6a. The gate electrode 6a contains the n-type dopant, which may increase the on-current of the n-MOS transistor 4a.

In the n-MOS transistor region 2a, the source and drain 7A and 7B may be constituted by the n-dopant diffusion layers. The n-dopant diffusion layers can be formed by diffusing an n-type dopant in the semiconductor substrate 1. Each of the n-dopant diffusion layers has first and second side edges. The first side edge of the n-dopant diffusion layer is aligned in plain view to the side edge of the gate electrode 6a. The second side edge of the n-dopant diffusion layer is bounded with the isolation region 3. The n-dopant diffusion layer extends from the side edge of the isolation region 3 to the position that is aligned in plain view to the side edge of the gate electrode 6a.

The n-dopant diffusion layer that constitutes the source 7A includes the first and second diffusion regions 7a and 7b. The second diffusion region 7b is positioned under the side wall 8. The first diffusion region 7a is disposed between the second diffusion region 7b and the isolation region 3. The first diffusion region 7a is greater in depth and dopant concentration than the second diffusion region 7b. Thus, the source 7A has the lightly doped drain structure.

The n-dopant diffusion layer that constitutes the drain 7B includes the third and fourth diffusion regions 7c and 7d. The fourth diffusion region 7d is positioned under the side wall 8. The third diffusion region 7c is disposed between the fourth diffusion region 7d and the isolation region 3. The third diffusion region 7c is greater in depth and dopant concentration than the fourth diffusion region 7d. Thus, the drain 7B has the lightly doped drain structure.

The lightly doped drain structures of the source and drain 7A and 7B can relax field concentration near the drain 7B. Relaxation of the field concentration can prevent generation of hot carrier, wherein the hot carrier generation is caused by the field concentration. Prevision of the hot carrier generation can prevent deterioration of performances such as threshold variation of the semiconductor device, wherein the threshold variation is caused by the hot carrier.

The n-MOS transistor 4a is configured so that a gate voltage is applied to the gate electrode 6a under application of a bias voltage to between the source and drain 7A and 7B, leading to appearance of an n-channel region through which electron can move between the source and drain 7A and 7B. The n-channel region is adjacent to the gate insulating film 5. The n-channel region extends between the second and fourth diffusion regions 7b and 7d.

In the p-MOS transistor region 2b, the gate electrode 6b may typically be made of a polysilicon-based conductive material doped with a p-type dopant. The gate electrode 6b contains the p-type dopant, which may increase the on-current of the p-MOS transistor 4b. The gate electrode 6b may also contain, in addition to the p-type dopant, an n-type dopant in at least a part adjacent to the gate insulating film 5. In other words, the gate electrode 6b may include a first part and a remaining part thereof. The first part is adjacent to the gate insulating film 5. The first part of the gate electrode 6b is disposed between the gate insulating film 5 and the remaining part of the gate electrode 6b. The first part of the gate electrode 6b contains at least the n-type dopant. Namely, the first part of the gate electrode 6b contains the n-type dopant in addition to the p-type dopant. The remaining part of the gate electrode 6b contains at least the p-type dopant. The first part of the gate electrode 6b is higher in n-type dopant concentration than the remaining part of the gate electrode 6b.

The gate electrode 6b has the first part that contains the n-type dopant. The first part is adjacent to the gate insulating film 5. The n-type dopant in the first part of the gate electrode 6b can prevent that application of a stress voltage to the gate electrode 6b hurts the p-MOS transistor 4b. Thus, the first part of the gate electrode 6b can prevent that continuous application of a stress voltage to the gate electrode 6b causes malfunction of the semiconductor device. The first part of the gate electrode 6b can ensure high reliance to the NBTI.

Typically, the gate electrode 6b may have a stacked structure which includes lower and upper layers 6c and 6d. The lower layer 6c of the gate electrode 6b contains an n-type dopant in addition to the p-type dopant. The upper layer 6d of the gate electrode 6b may contain almost only the p-type dopant. The upper layer 6d may be almost free of any n-type dopant.

The gate electrode 6b has the lower layer 6c that contains the n-type dopant. The gate electrode 6b is adjacent to the gate insulating film 5. The n-type dopant in the lower layer 6c of the gate electrode 6b can prevent that application of a stress voltage to the gate electrode 6b hurts the p-MOS transistor 4b. Thus, the lower layer 6c of the gate electrode 6b can prevent that continuous application of a stress voltage to the gate electrode 6b causes malfunction of the semiconductor device. The lower layer 6c of the gate electrode 6b can ensure high reliance to the NBTI.

For example, the lower layer 6c that contains the n-type dopant in addition to the p-type dopant may preferably have a thickness of about 30 nanometers, which ensures improvement in the reliance of the NBTI of the p-MOS transistor 4b.

For example, the adjacent portion of the gate electrode 6b that is adjacent to the gate insulating film 5 contains the n-type dopant in addition to the p-type dopant. The adjacent portion of the gate electrode 6b has the thickness of about 30 nanometers. The compositional ratio of n-type dopant to p-type dopant in the adjacent portion may be preferably in the range of 10% to 40%, and more preferably in the range of 30% to 40%. When the compositional ratio of n-type dopant to p-type dopant of the in the lower layer 6c is less than 10%, it is possible that sufficient improvement in the reliance of the NBTI is not obtained. When the compositional ratio of n-type dopant to p-type dopant of the in the lower layer 6c is more than 40%, it is possible that the performances such as the on-current of the p-MOS transistor 4b are deteriorated.

The side walls 8 made of an insulator are disposed on the side faces of the gate electrode 6b.

In the p-MOS transistor region 2b, the source and drain 7D and 7E may be constituted by the p-dopant diffusion layers. The p-dopant diffusion layers can be formed by diffusing a p-type dopant in the semiconductor substrate 1. Each of the p-dopant diffusion layers has first and second side edges. The first side edge of the p-dopant diffusion layer is aligned in plain view to the side edge of the gate electrode 6b. The second side edge of the p-dopant diffusion layer is bounded with the isolation region 3. The p-dopant diffusion layer extends from the side edge of the isolation region 3 to the position that is aligned in plain view to the side edge of the gate electrode 6b.

The p-dopant diffusion layer that constitutes the source 7D includes the fifth and sixth diffusion regions 7e and 7f. The sixth diffusion region 7f is positioned under the side wall 8. The fifth diffusion region 7e is disposed between the sixth diffusion region 7f and the isolation region 3. The fifth diffusion region 7e is greater in depth and dopant concentration than the sixth diffusion region 7f. Thus, the source 7D has the lightly doped drain structure.

The p-dopant diffusion layer that constitutes the drain 7E includes the seventh and eighth diffusion regions 7g and 7h. The eighth diffusion region 7h is positioned under the side wall 8. The seventh diffusion region 7g is disposed between the eighth diffusion region 7h and the isolation region 3. The seventh diffusion region 7g is greater in depth and dopant concentration than the eighth diffusion region 7h. Thus, the drain 7E has the lightly doped drain structure.

The lightly doped drain structures of the source and drain 7D and 7E can relax field concentration near the drain 7E. Relaxation of the field concentration can prevent generation of hot carrier, wherein the hot carrier generation is caused by the field concentration. Prevision of the hot carrier generation can prevent deterioration of performances such as threshold variation of the semiconductor device, wherein the threshold variation is caused by the hot carrier.

The p-MOS transistor 4b is configured so that a gate voltage is applied to the gate electrode 6b under application of a bias voltage to between the source and drain 7D and 7E, leading to appearance of a p-channel region through which electron can move between the source and drain 7D and 7E. The p-channel region is adjacent to the gate insulating film 5. The p-channel region extends between the sixth and eighth diffusion regions 7f and 7h.

An inter-layer insulator 9 extends over the gate insulating film 5 and the gate electrodes 6a and 6b with the side walls 8. Contact holes 10 penetrate the inter-layer insulator 9 and the gate insulating film 5. The contact holes 10 reach the first, third, fifth and seventh diffusion regions 7a, 7c, 7e and 7g. Contact plugs 11 fill up the contact holes 10. The contact plugs 11 penetrate the inter-layer insulator 9 and the gate insulating film 5. The contact plugs 11 contact the first, third, fifth and seventh diffusion regions 7a, 7c, 7e and 7g. Namely, the contact plugs 11 contact the source and drain 7A and 7B of the n-MOS transistor 4a and the source and drain 7D and 7E of the p-MOS transistor 4b. Interconnections 12 extend over the inter-layer insulator 9 and the contact plugs 11. The interconnections 12 contact the contact plugs 11 so that the interconnections 12 are electrically connected through the contact plugs 11 to the first, third, fifth and seventh diffusion regions 7a, 7c, 7e and 7g. In other words, the interconnections 12 are electrically connected through the contact plugs 11 to the source and drain 7A and 7B of the n-MOS transistor 4a and the source and drain 7D and 7E of the p-MOS transistor 4b. The gate electrodes 6a and 6b are also connected through contact plugs to interconnections, wherein the contact plugs and the interconnections are not illustrated. A passivation film 13 is formed over the interconnections 12 and the inter-layer insulator 9, thereby completing a semiconductor device having a CMOS circuit.

A method of forming the semiconductor device with the CMOS circuit shown in FIG. 1 will be described. FIGS. 2A through 2D are fragmentary cross sectional elevation views illustrating sequential steps involved in a method of forming the semiconductor device shown in FIG. 1.

Figure 2A:
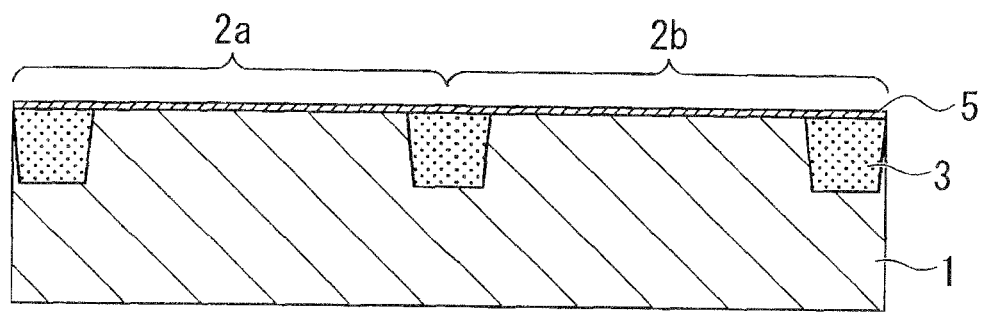
FIGS. 2A through 2D are fragmentary cross sectional elevation views illustrating sequential steps involved in a method of forming the semiconductor device shown in FIG. 1.

With reference to FIG. 2A, a semiconductor substrate 1 is prepared. A shallow trench isolation process is carried out to selectively form isolation regions 3 in a shallow region of the semiconductor substrate 1, thereby defining an n-MOS transistor region 2a and a p-MOS transistor region 2b. A thermal oxidation process is then carried out to form a gate insulating film 5 over the surface of the semiconductor substrate 1 and the isolation regions 3. The gate insulating film 5 has a thickness in the range of 1 nanometer to 10 nanometers.

Figure 2B:
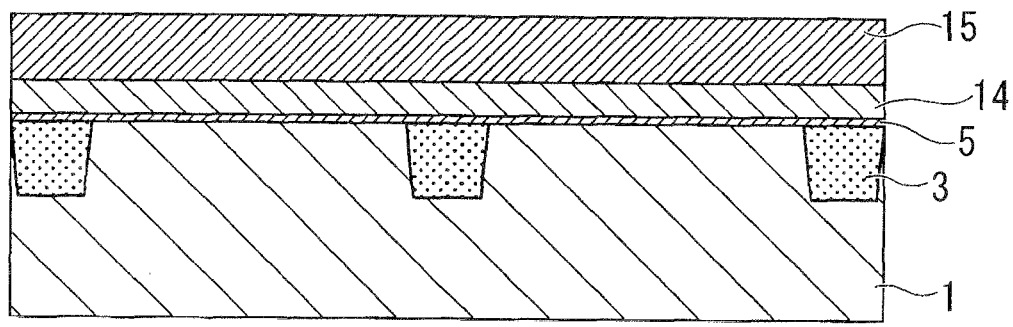

With reference to FIG. 2B, a chemical vapor deposition process is carried out to form a first polysilicon layer 14 over the gate insulating film 5. The first polysilicon layer 14 is doped with an n-type dopant. The first polysilicon layer 14 is the n-doped polysilicon layer. The first polysilicon layer 14 has a thickness in the range of 10 nanometers to 50 nanometers. A second polysilicon layer 15 that is substantially free of any dopant is formed over the first polysilicon layer 14. The second polysilicon layer 15 is the non-doped polysilicon layer. The second polysilicon layer 15 has a thickness in the range of 50 nanometers to 100 nanometers. Thus, a stack of the first and second polysilicon layers 14 and 15 is formed over the gate insulating film 5. The concentration of the n-type dopant of the first polysilicon layer 14 will be described later, The ratio in thickness of the first polysilicon layer 14 to the second polysilicon layer 15 will also be described later.

Figure 2C:
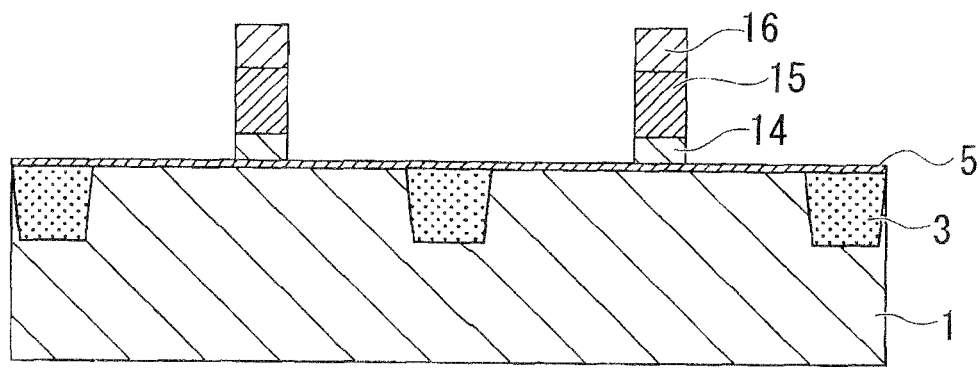

With reference to FIG. 2C, a resist film is applied on the second polysilicon layer 15. A lithography process is carried out to form a first resist pattern 16. The first resist pattern 16 is a pattern for forming gate electrodes of an n-MOS transistor 4a and a p-MOS transistor 4b. A dry etching process is carried out using the first resist pattern 16 as a mask to selectively remove the stack of the first and second polysilicon layers 14 and 15, thereby forming gate structures in the n-MOS transistor region 2a and the p-MOS transistor region 2b. Each gate structure is constituted by the stack of the remaining parts of the first and second polysilicon layers 14 and 15.

Figure 2D:
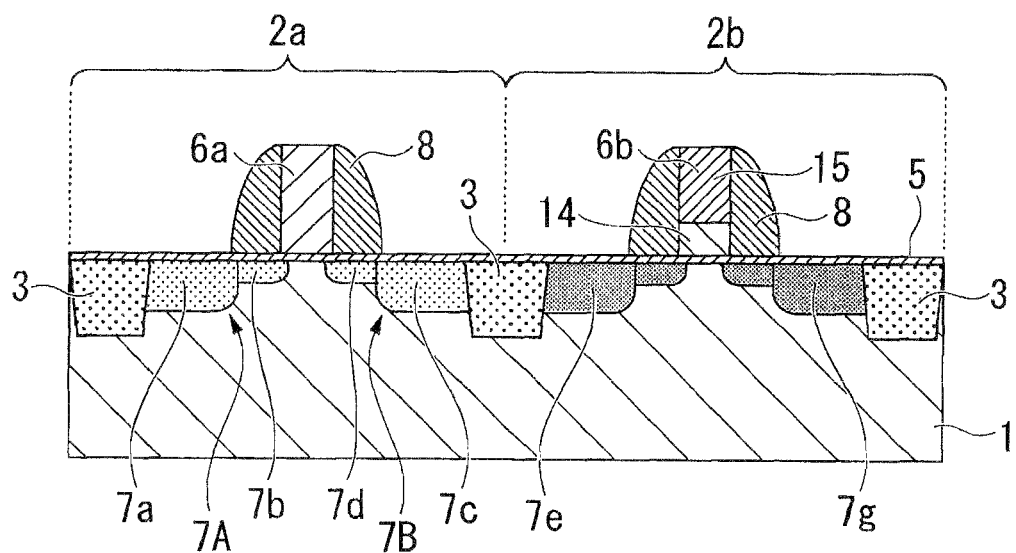

With reference to FIG. 2D, the first resist pattern 16 is removed. The first resist pattern 16 is removed. A resist film is applied on the gate structures and the gate insulating film 5 over the n-MOS transistor region 2a and the p-MOS transistor region 2b. A lithography process is carried out to form a second resist pattern which has an opening. The opening of the second resist pattern is positioned over the n-MOS transistor region 2a. A first n+-ion implantation process is carried out using the second resist pattern as a mask to selectively introduce the n+-ions into the n-MOS transistor region 2a of the semiconductor substrate, except under the gate structure in the n-MOS transistor region 2a, and also into the gate structure in the n-MOS transistor region 2a. The second resist pattern is removed.

A new resist film is applied on the gate structures and the gate insulating film 5 over the n-MOS transistor region 2a and the p-MOS transistor region 2b. A lithography process is carried out to form a third resist pattern which has an opening. The opening of the third resist pattern is positioned over the p-MOS transistor region 2b. A first p+-ion implantation process is carried out using the third resist pattern as a mask to selectively introduce the p+-ions into the p-MOS transistor region 2b of the semiconductor substrate, except under the gate structure in the p-MOS transistor region 2b, and also into the gate structure in the p-MOS transistor region 2b. The third resist pattern is removed.

In the n-MOS transistor region 2a, the n-type dopant is introduced into the first and second polysilicon layers 14 and 15 and the source and drain regions 7A and 7B in the semiconductor substrate 1.

In the p-MOS transistor region 2b, the p-type dopant is introduced into the first and second polysilicon layers 14 and 15 and the source and drain regions 7D and 7E in the semiconductor substrate 1.

Side walls 8 are formed on the side faces of the first and second polysilicon layers 14 and 15 in the n-MOS transistor region 2a and the p-MOS transistor region 2b. The side walls 8 have a thickness in the range of 5 nanometers to 20 nanometers. The side walls 8 may be made of an insulator such as oxide or nitride.

A resist film is applied on the gate structures with the side walls 8 and the gate insulating film 5 over the n-MOS transistor region 2a and the p-MOS transistor region 2b. A lithography process is carried out to form a fourth resist pattern which has an opening. The opening of the fourth resist pattern is positioned over the n-MOS transistor region 2a. A second n+-ion implantation process is carried out using the fourth resist pattern as a mask to selectively introduce the n+-ions into the n-MOS transistor region 2a of the semiconductor substrate, except under the gate structure in the n-MOS transistor region 2a, and also into the gate structure in the n-MOS transistor region 2a. As a result, the gate electrode 6a and the source and drain 7A and 7B are formed in the n-MOS transistor region 2a. The fourth resist pattern is removed.

A new resist film is applied on the gate structures and the gate insulating film 5 over the n-MOS transistor region 2a and the p-MOS transistor region 2b. A lithography process is carried out to form a fifth resist pattern which has an opening. The opening of the fifth resist pattern is positioned over the p-MOS transistor region 2b. A second p+-ion implantation process is carried out using the fifth resist pattern as a mask to selectively introduce the p+-ions into the p-MOS transistor region 2b of the semiconductor substrate, except under the gate structure in the p-MOS transistor region 2b, and also into the gate structure in the p-MOS transistor region 2b. As a result, the gate electrode 6b and the source and drain 7D and 7E are formed in the p-MOS transistor region 2a. The fifth resist pattern is removed.

As described above, the first polysilicon layer 14 has been doped with the n-type dopant before the first and second n+-ion implantation processes are carried out. The first polysilicon layer 14 is undoped before the first and second n+-ion implantation processes are carried out.

In the n-MOS transistor region 2a, the first polysilicon layer 14 of the gate electrode 6a contains a total amount of n-type dopant that has pre-existed in the first polysilicon layer 14 and n-type dopant that is newly introduced by the first and second n+-ion implantation processes. The second polysilicon layer 15 of the gate electrode 6a contains a total amount of n-type dopant that is newly introduced by the first and second n+-ion implantation processes. The first polysilicon layer 14 of the gate electrode 6a is higher in n-type dopant concentration than the second polysilicon layer 15 of the gate electrode 6a.

In the n-MOS transistor region 2a, the second and fourth diffusion regions 7b and 7d contain an amount of the n-type dopant that has been introduced by the first n+-ion implantation process. The first and third diffusion regions 7a and 7c contain a total amount of the n-type dopant that has been introduced by the first and second n+-ion implantation processes. The first and third diffusion regions 7a and 7c are higher in n-type dopant concentration than the second and fourth diffusion regions 7b and 7d. The source 7A has the first diffusion region 7a and the second diffusion region 7b that is lower in f-type dopant concentration than the first diffusion region 7a. The source 7A has the lightly doped drain structure. The drain 7B has the third diffusion region 7c and the fourth diffusion region 7d that is lower in n-type dopant concentration than the third diffusion region 7c. The drain 7B has the lightly doped drain structure.

In the p-MOS transistor region 2b, the first polysilicon layer 14 as the lower layer 6c of the gate electrode 6b contains an amount of n-type dopant that has pre-existed in the first polysilicon layer 14 and a total amount of p-type dopant that is newly introduced by the first and second p+-ion implantation processes. Namely, the first polysilicon layer 14 as the lower layer 6c of the gate electrode 6b contains not only the p-type dopant that has been introduced by the first and second p+-ion implantation processes but the n-type dopant that has pre-existed therein. The second polysilicon layer 15 as the upper layer 6d of the gate electrode 6b contains a total amount of p-type dopant that is introduced by the first and second p+-ion implantation processes. The first polysilicon layer 14 as the lower layer 6c of the gate electrode 6b is higher in n-type dopant concentration than the second polysilicon layer 15 as the upper layer 6d of the gate electrode 6b.

In the p-MOS transistor region 2b, the sixth and eighth diffusion regions 7f and 7h contain an amount of the p-type dopant that has been introduced by the first p+-ion implantation process. The fifth and seventh diffusion regions 7e and 7g contain a total amount of the p-type dopant that has been introduced by the first and second p+-ion implantation processes. The fifth and seventh diffusion regions 7e and 7g are higher in p-type dopant concentration than the sixth and eighth diffusion regions 7f and 7h. The source 7D has the fifth diffusion region 7e and the sixth diffusion region 7f that is lower in p-type dopant concentration than the fifth diffusion region 7e. The source 7D has the lightly doped drain structure. The drain 7E has the seventh diffusion region 7g and the eighth diffusion region 7h that is lower in p-type dopant concentration than the seventh diffusion region 7g. The drain 7E has the lightly doped drain structure.

An anneal process is carried out to activate the n-type dopant in the gate electrode 6a and the source and drain 7A and 7B as well as activate the p-type dopant in the gate electrode 6b and the source and drain 7D and 7E, provided that the gate electrode 6b has a portion adjacent to the gate insulating film 5, and this adjacent portion contains more n-type dopant than p-type dopant.

The temperature of the anneal is preferably in the range of 850° C. to 1050° C.

As described above, the lower layer 6c of the gate electrode 6b contains the n-type dopant in addition to the p-type dopant and has the thickness of about 30 nanometers. The compositional ratio of n-type dopant to p-type dopant of the adjacent portion of the gate electrode 6b may be preferably in the range of 10% to 40%, and more preferably in the range of 30% to 40%. When the compositional ratio of n-type dopant to p-type dopant of the in the lower layer 6c is less than 10%, it is possible that sufficient improvement in the reliance of the NBTI is not obtained. When the compositional ratio of n-type dopant to p-type dopant of the in the lower layer 6c is more than 40%, it is possible that the performances such as the on-current of the p-MOS transistor 4b are deteriorated.

The concentration of the n-type dopant of the adjacent portion of the gate electrode 6b might be controllable by controlling the concentration of the n-type dopant of the first polysilicon layer 14 and the thickness of the first polysilicon layer 14 in the process shown in FIG. 2B, wherein the adjacent portion of the gate electrode 6b is positioned adjacent to the gate insulating film 5.

In some cases, the dose of n-type dopant into the first polysilicon layer 14 may be preferably in the range of 1E13 atoms/cm$^2$ to 1E15 atoms/cm$^2$, and more preferably in the range of 1E13 atoms/cm2 to 1E14 atoms/cm$^2$. If the concentration of n-type dopant of the first polysilicon layer 14 is lower than 1E13 atoms/cm$^2$, then the adjacent portion of the gate electrode 6b has a lower compositional ratio of the n-type dopant to the p-type dopant than the ratio that needs to improve the reliance of the NBTI of the p-MOS transistor 4b. If the concentration of n-type dopant of the first polysilicon layer 14 is higher than 1E15 atoms/cm$^2$, then the adjacent portion of the gate electrode 6b has a higher compositional ratio of the n-type dopant to the p-type dopant than the ratio that needs to ensure the performances such as on-current of the p-MOS transistor 4b. In some cases, the concentration of p-type dopant of the first polysilicon layer 14 may be preferably in the range of 1E19 atoms/cm$^3$ to 1E21 atoms/cm$^3$.

The ratio in thickness of the first polysilicon layer 14 to the second polysilicon layer 15 may be preferably in the range of 10% to 50%, and more preferably in the range of 10% to 20%. If the ratio in thickness of the first polysilicon layer 14 to the second polysilicon layer 15 is lower than 10%, then the adjacent portion of the gate electrode 6b has a lower compositional ratio of the n-type dopant to the p-type dopant than the ratio that might need to improve the reliance of the NBTI of the p-MOS transistor 4b. If the ratio in thickness of the first polysilicon layer 14 to the second polysilicon layer 15 is higher than 50%, then the adjacent portion of the gate electrode 6b has a higher compositional ratio of the n-type dopant to the p-type dopant than the ratio that needs to ensure the performances such as on-current of the p-MOS transistor 4b.

With reference again to FIG. 2D, an inter-layer insulator 9, contact plugs 11, metal interconnections 12 and a passivation film 13 are formed in the known processes, thereby completing the semiconductor device having the CMOS circuit.

In the CMOS circuit, the p-MOS transistor 6b has the adjacent portion that is adjacent to the gate insulating film 5, where the adjacent portion contains n-type dopant in addition to p-type dopant, thereby obtaining the reliance of the NBTI.

The semiconductor device having the CMOS circuit has the gate insulating film 5 that has a uniform thickness. In view of the method of forming the semiconductor device, an additional process is a process for forming the first polysilicon layer 14, in order to obtain the CMOS circuit that is superior in the NBTI reliance. The stack of the first and second polysilicon layers 14 and 15 can be formed by the continuous chemical vapor deposition process with changing the reaction gas. The gate insulating film 5 with the uniform thickness is disposed over the n-MOS transistor region 2a and the p-MOS transistor region 2b. The process for forming the thickness-uniform gate insulating film 5 is simpler than the process for forming the thickness-varying gate insulating film. The above-described gate electrode 6b and the thickness-uniform gate electrode 5 can allow that the CMOS circuit having high NBTI reliance is formed by the simplified processes.

EXAMPLE

An isolation region was formed on a silicon substrate. A thermal oxidation of silicon was carried out to form a gate oxide film having a thickness of 3 nanometers.

A thermal chemical vapor deposition process was carried out to form an n-doped polysilicon layer over the gate oxide film. The n-doped polysilicon layer will be hereinafter referred to as a first polysilicon layer. The first polysilicon layer has a thickness of 20 nanometers. The first polysilicon layer has a phosphorus concentration of 5E13 atoms/cm$^3$.

A thermal chemical vapor deposition process was carried out to form a non-doped polysilicon layer over the first polysilicon layer, thereby forming a polysilicon stack-layered structure over the gate oxide film. The non-doped polysilicon layer will be hereinafter referred to as a second polysilicon layer. The second polysilicon layer has a thickness of 60 nanometers.

A photolithography process and a dry etching process were carried out to pattern the stack-layered structure of the first and second polysilicon layers, thereby forming gate electrode structures for n-MOS transistor and p-MOS transistor.

A first n+-ion implantation process was carried out at a dose of 3E13 atoms/cm$^2$ to introduce phosphorus as an n-type dopant into the n-MOS transistor region. Then, a second p+-ion implantation process was carried out at a dose of 3E13 atoms/cm$^2$ to introduce boron as a p-type dopant into the p-MOS transistor region.

Side walls were formed on side faces of the gate electrode structures of the first and second polysilicon layers. The side walls have a thickness of 20 nanometers.

A second n+-ion implantation process was carried out at a dose of 3E15 atoms/cm$^2$ to introduce phosphorus as an n-type dopant into the n-MOS transistor region. Then, a second p+-ion implantation process was carried out at a dose of 3E15 atoms/cm$^2$ to introduce boron as a p-type dopant into the p-MOS transistor region, thereby forming gate electrodes and source and drain regions in the n-MOS transistor region and the p-MOS transistor region.

An annealing process was carried out to heat the silicon substrate at 1000° C. The gate electrode in the p-MOS transistor region has an adjacent portion that is adjacent to the gate oxide film. The adjacent portion has a thickness of 30 nanometers. The adjacent portion of the gate electrode in the p-MOS transistor region has an n-type dopant concentration of 5E19 atoms/cm$^3$. The compositional ratio of n-type dopant to p-type dopant of the adjacent portion is 40% (p-type dopant:n-type dopant=5:2). An inter-layer insulator, contact plugs, metal interconnections and a passivation film were formed in the known processes, thereby completing the semiconductor device having the CMOS circuit.

Comparative Example

The semiconductor device having the CMOS circuit was formed in the same processes, provided that a single layered structure of a non-doped polysilicon layer was formed by a thermal chemical vapor deposition method, instead of the stack-layered structure of the first and second polysilicon layers.

Evaluation on NBTI Reliance

Each type of the semiconductor devices with the CMOS circuits in Example and Comparative Example was examined in NBTI reliance as follows. A stress voltage Vgs was applied to the gate electrode of the p-MOS transistor to confirm a stress-voltage-applying time (t50) that it takes to cause malfunction at 50% of the CMOS circuits under application of the stress voltage. Application of a stress voltage Vgs to the gate electrode of the p-MOS transistor for the stress-voltage-applying time (t50) causes at 50% malfunction of the CMOS circuits. This test was carried out by varying the stress voltage level.

Figure 3:
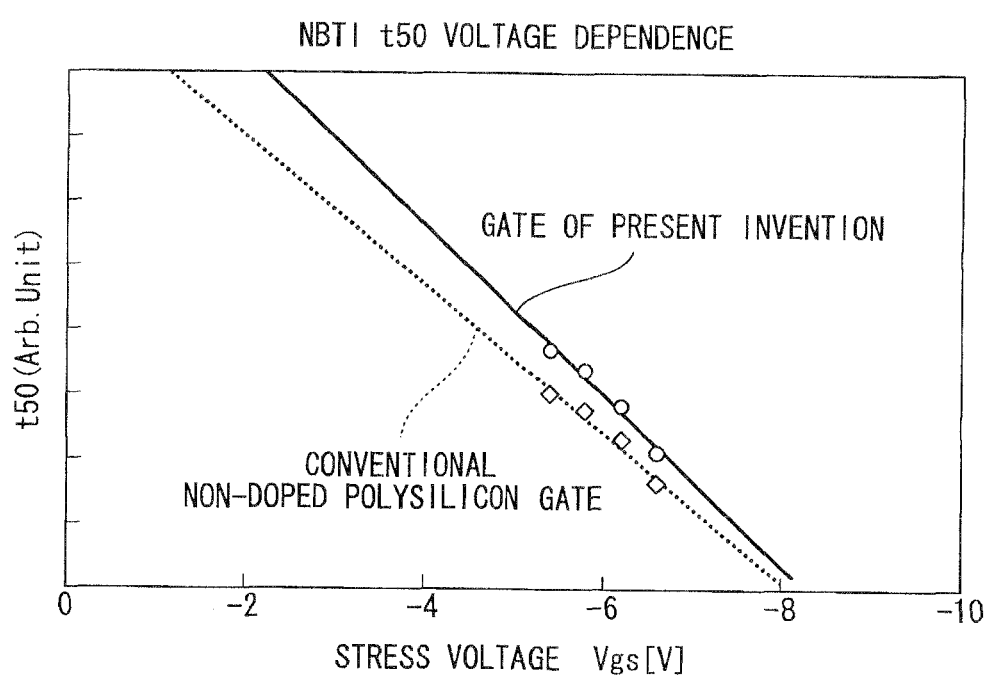
FIG. 3 is a diagram illustrating variation of the stress-voltage-applying time (t50) over the stress voltage Vgs for each of the semiconductor devices with the CMOS circuits in Example and Comparative Example.
Figure 4A:
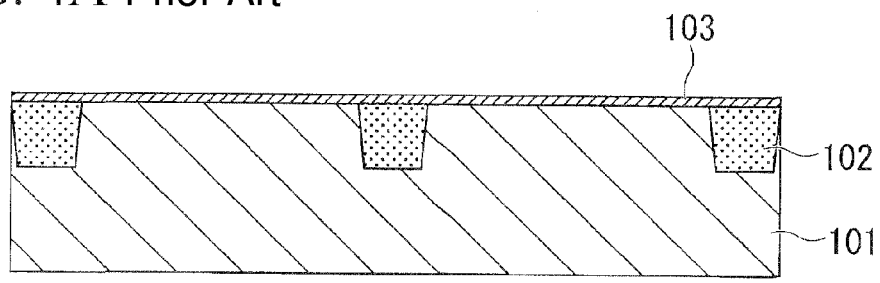
FIGS. 4A through 4F are fragmentary cross sectional elevation views illustrating conventional semiconductor devices in sequential steps involved in a conventional method of manufacturing the same.
Figure 4B:
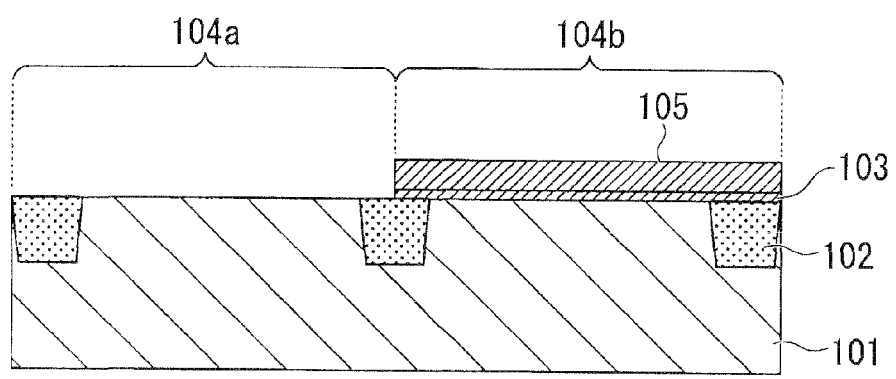
Figure 4C:
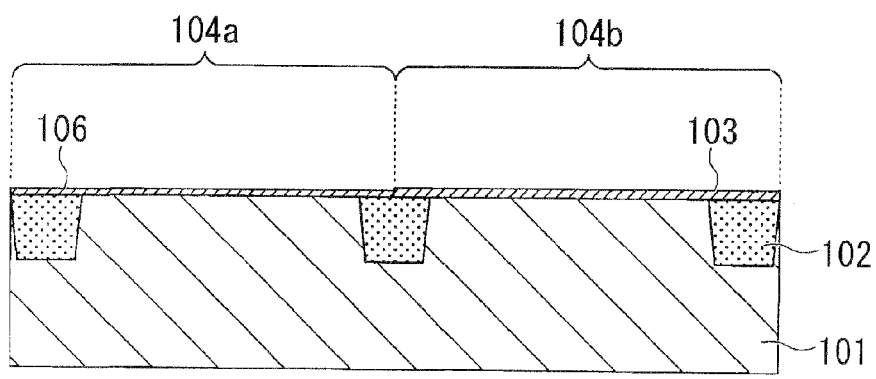
Figure 4D:
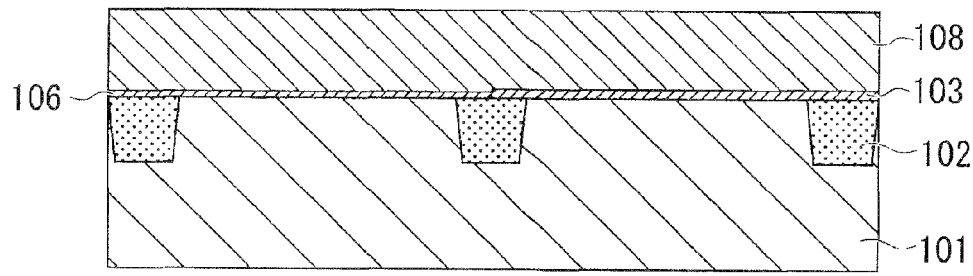
Figure 4E:
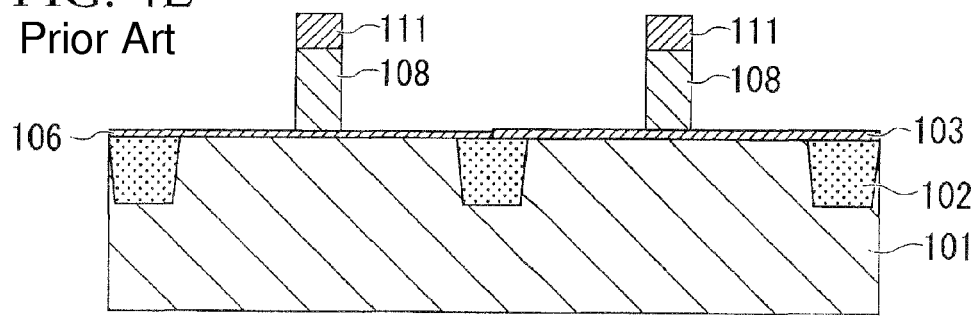
Figure 4F:
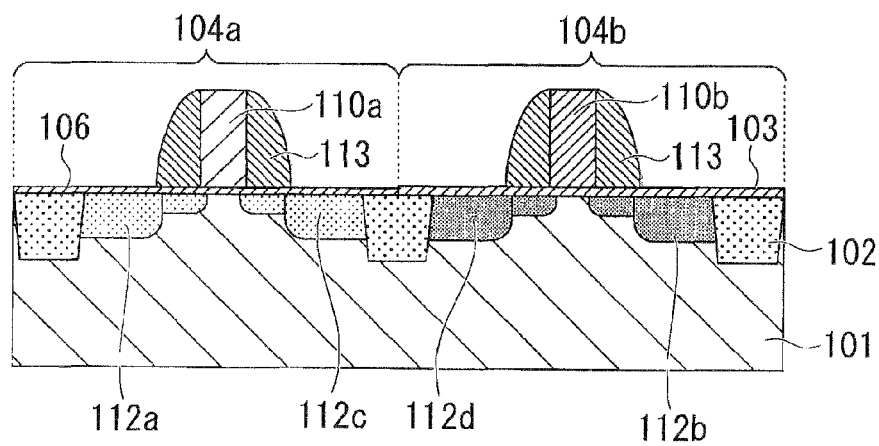
Figure 5:
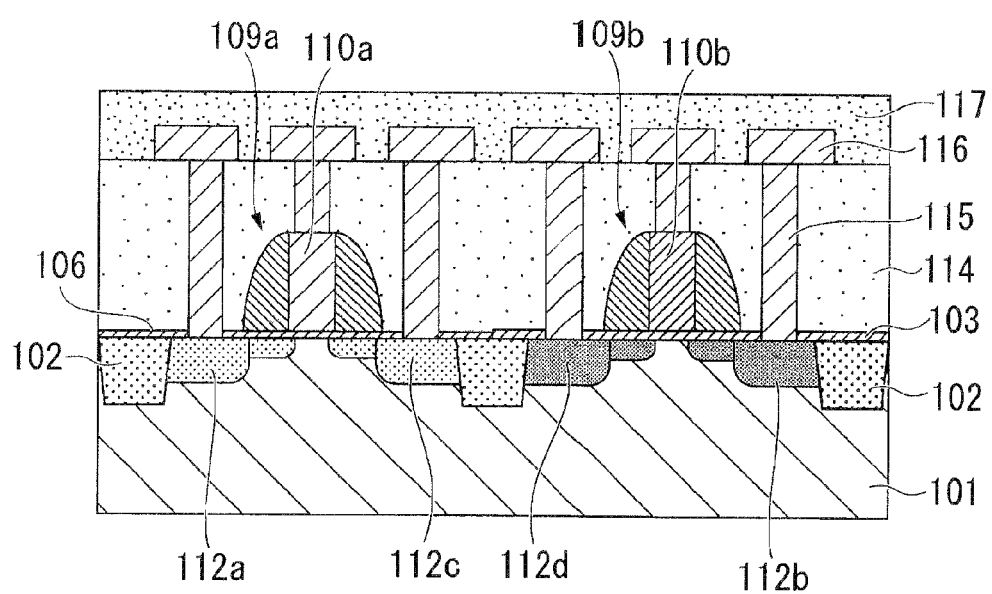
FIG. 5 is a fragmentary cross sectional elevation view illustrating the conventional semiconductor device that is formed by the conventional manufacturing method shown in FIGS. 4A through 4F.

FIG. 3 is a diagram illustrating variation of the stress-voltage-applying time (t50) over the stress voltage Vgs for each of the semiconductor devices with the CMOS circuits in Example and Comparative Example. The real line represents the voltage-dependency of the stress-voltage-applying time (t50) of the semiconductor device in accordance with Example. The dotted line represents the voltage-dependency of the stress-voltage-applying time (t50) of the semiconductor device in accordance with Comparative Example.

The semiconductor device in accordance with Example is longer in the stress-voltage-applying time (t50) than the semiconductor device in accordance with Comparative Example. This demonstrates that the semiconductor device in accordance with Example is more unlikely to cause malfunction than the semiconductor device in accordance with Comparative Example. Thus, the n-dopant-containing adjacent portion of the gate electrode of the p-MOS transistor can improve the NBTI reliance as much as the gate insulating film of the p-MOS transistor is thicker than the gate insulating film of the n-MOS transistor.

The above-described structure of the gate electrode can be applied to the semiconductor device including the n-MOS transistor and the p-MOS transistor.

As used herein, the following directional terms "forward, rearward, above, downward, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A semiconductor device, comprising:
   an n-MOS transistor formed in a substrate; and
   a p-MOS transistor formed in the substrate that comprises a gate insulating film and a gate electrode, the gate electrode having an adjacent portion that is adjacent to the gate insulating film, the adjacent portion comprising a polysilicon that contains a composition of both n-type and p-type dopants, and an upper portion formed on the adjacent portion, the upper portion comprising a polysilicon that contains a composition of p-type dopant.

2. The semiconductor device according to claim 1, wherein the adjacent portion has a thickness of at least 30 nanometers from the interface between the gate electrode and the gate insulating film.

3. The semiconductor device according to claim 1, wherein the adjacent portion has a compositional ratio of the n-type dopant to the p-type dopant in the range of 10% to 40%.

4. The semiconductor device according to claim 1, wherein the upper portion is free of the n-type dopant.

5. A semiconductor device, comprising:
   a semiconductor substrate having an n-MOS transistor region and a p-MOS transistor region;
   a gate insulating film on a surface of the semiconductor substrate, the gate insulating film being deposited on the n-MOS transistor region and the p-MOS transistor region;
   a first gate electrode on the gate insulating film, the first gate electrode being located in the n-MOS transistor region, the first gate electrode comprising a first polysilicon layer containing an n-type dopant;
   a second gate electrode on the gate insulating film, the second gate electrode being located in the p-MOS transistor region, the second gate electrode comprising a second polysilicon layer containing a p-type dopant;
   first source/drain electrodes on the surface of the semiconductor substrate, the first source/drain electrodes being located in the n-MOS transistor region, the first source/drain electrodes containing an n-type dopant; and
   second source/drain electrodes on the surface of the semiconductor substrate, the second source/drain electrodes being located in the p-MOS transistor region, the second source/drain electrodes containing a p-type dopant,
   wherein the second polysilicon layer comprises a first portion on the gate insulating film and a second portion on the first portion, the first portion comprising an n-type dopant and the p-type dopant, and the second portion comprising the p-type dopant.

6. The semiconductor device according to claim 5, wherein a thickness ratio of the first portion to a total thickness of the first portion and the second portion of the second polysilicon layer is from 10% to 50%.

7. The semiconductor device according to claim 6, wherein a thickness of the first portion of the second polysilicon layer is less than 30 nanometers.

8. The semiconductor device according to claim 5, wherein a compositional ratio of the n-type dopant to the p-type dopant in the first portion of the second polysilicon layer is from 10% to 40%.

9. The semiconductor device according to claim 8, wherein a concentration of the n-type dopant in the first portion of the second polysilicon layer is from $1E19$ atoms/cm$^3$ to $1E21$ atoms/cm$^3$.

10. The semiconductor device according to claim 5, wherein the first polysilicon layer includes the n-type dopant being introduced into the first source/drain electrodes, and the second polysilicon layer includes the p-type dopant being introduced into the second source/drain electrodes.

11. The semiconductor device according to claim 5, wherein the second portion is free of the n-type dopant.

12. A semiconductor device comprising:
    an n-MOS transistor; and
    a p-MOS transistor that comprises a gate insulating film and a gate electrode, the gate electrode having an adjacent portion that contacts the gate insulating film, the adjacent portion comprising a polysilicon that contains both an n-type dopant and a p-type dopant, the n-type dopant and the p-type dopant each being present throughout an entire gate length of said adjacent portion.

13. The semiconductor device according to claim 12, wherein the gate electrode comprises a lower layer constituting the adjacent portion and an upper layer that contains the p-type dopant but is free of the n-type dopant.

14. The semiconductor device according to claim 12, wherein the adjacent portion has a thickness of at least 30 nanometers from the interface between the gate electrode and the gate insulating film.

* * * * *